US008311239B2

(12) United States Patent
Kim et al.

(10) Patent No.: US 8,311,239 B2
(45) Date of Patent: Nov. 13, 2012

(54) METHOD AND APPARATUS FOR AUDIO BASS ENHANCEMENT USING STEREO SPEAKERS

(75) Inventors: Jung-ho Kim, Yongin-si (KR); Sang-chul Ko, Seoul (KR); Young-tae Kim, Seongnam-si (KR); Sang-wook Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1357 days.

(21) Appl. No.: 11/896,109

(22) Filed: Aug. 29, 2007

(65) Prior Publication Data

US 2008/0152175 A1 Jun. 26, 2008

(30) Foreign Application Priority Data

Dec. 20, 2006 (KR) ........................ 10-2006-0131156

(51) Int. Cl.
*H03G 5/00* (2006.01)
*H03G 9/00* (2006.01)
*H03G 3/00* (2006.01)

(52) U.S. Cl. ............ 381/98; 381/99; 381/102; 381/104; 381/107

(58) Field of Classification Search .................. 381/300, 381/303, 98–99, 104–107, 102
See application file for complete search history.

(56) References Cited

U.S. PATENT DOCUMENTS

| | | | | |
|---|---|---|---|---|
| 6,587,682 | B2 * | 7/2003 | Howard | 455/416 |
| 6,771,784 | B2 * | 8/2004 | Murata | 381/111 |
| 2004/0022400 | A1 * | 2/2004 | Magrath | 381/106 |
| 2006/0093160 | A1 * | 5/2006 | Linse et al. | 381/99 |
| 2006/0147046 | A1 * | 7/2006 | Kasargod et al. | 381/1 |

* cited by examiner

*Primary Examiner* — Devona Faulk
*Assistant Examiner* — George Monikang
(74) *Attorney, Agent, or Firm* — Staas & Halsey LLP

(57) ABSTRACT

Provided are a method and apparatus for audio bass enhancement using stereo speakers. By filtering a baseband signal of an input signal whose frequency is lower than a blocking frequency calculated based on the distance between first and second speakers, delaying the filtered signal for a predetermined time period, combining a signal component of the input signal output from the first speaker and a signal component of the delayed signal output from the first speaker and making the combined signal component correspond to the first speaker, and combining a signal component of the input signal output from the second speaker and a signal component of the delayed signal output from the second speaker and making the combined signal component correspond to the second speaker, deep and rich audio bass can be provided by a simple operation without structural modification of speakers with respect to micro speakers in which audio bass reproduction is not conventionally performed efficiently.

21 Claims, 8 Drawing Sheets
(2 of 8 Drawing Sheet(s) Filed in Color)

METHOD AND APPARATUS FOR AUDIO BASS ENHANCEMENT USING STEREO SPEAKERS

CROSS-REFERENCE TO RELATED PATENT APPLICATION

This application claims the benefit of Korean Patent Application No. 10-2006-0131156, filed on Dec. 20, 2006, in the Korean Intellectual Property Office, the disclosure of which is incorporated herein in its entirety by reference.

BACKGROUND OF THE INVENTION

1. Field of the Invention

The present invention relates to audio bass enhancement, and more particularly, to an apparatus and a method for audio base enhancement, which use the fact that a baseband signal output from two speakers is recognized as if the signal is output from one sound source when the distance between the speakers is short.

2. Description of the Related Art

Speakers are acoustic devices which radiate audio waves by generating longitudinal waves in the air by changing an electrical signal into vibrations of a vibrating plate. The speakers only reproduce a signal within a predetermined frequency range due to their structural characteristics. That is, speakers can only reproduce an input electrical signal corresponding to a predetermined frequency reproduction band into an undistorted signal. The minimum reproduction frequency corresponding to the frequency reproduction band is the lowest frequency at which sound can be reproduced without distortion within the frequency reproduction band.

Thus, in order to reproduce low frequency bass signals, speakers must be designed so that the minimum reproduction frequency is low. In order to lower the minimum reproduction frequency of speakers, speakers must have a large-caliber vibrating plate and be thick enough to ensure sufficient amplitude of the output bass signal.

However, due to a trend towards light, thin, and miniaturized electronic products, the size of speakers for generating sound from various acoustic products has gradually been miniaturized. Also, installation space of speakers has been reduced. Thus, for micro speakers used in mobile phones, portable multimedia devices, and headphones, only speakers whose bass reproduction limit frequency is around a few hundreds of hertz (Hz) are produced due to the size limitation of the micro speakers. However, since the human-audible band is conventionally from 20 Hz to 20,000 Hz, a non-reproducible band of base sound corresponding to a frequency range from 20 Hz to a few hundreds of Hz, that is, the bass reproduction limit frequency, exists in micro speakers. Due to the structural limitations of the micro speakers, audiences only hear a relatively plain sound in which deep and rich audio bass is not included.

To solve the problem described above, a method of reproducing audio bass using psychoacoustics has been developed. However, a complicated operation is required to realize the method. As a result, adoption of the method is determined according to capabilities of a digital signal processor (DSP) of a product in which the method is to be adopted.

SUMMARY OF THE INVENTION

The present invention provides a method and apparatus for providing audio bass to audiences by performing simple signal processing without structural modification of speakers when audio bass is reproduced using micro speakers.

The present invention also provides a computer-readable recording medium having embodied thereon a computer program for executing the aforementioned method.

The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art.

According to an aspect of the present invention, there is provided an apparatus for audio bass enhancement using stereo speakers, the apparatus including a low-pass filter which calculates a blocking frequency based on the distance between first and second speakers and filters a baseband signal of an input signal whose frequency is lower than the blocking frequency; a delayer which delays the filtered baseband signal for a predetermined time period; a first signal combiner which combines a signal component of the input signal output from the first speaker and a signal component of the delayed signal output from the first speaker, and makes the combined signal component correspond to the first speaker; and a second signal combiner which combines a signal component of the input signal output from the second speaker and a signal component of the delayed signal output from the second speaker, and makes the combined signal component correspond to the second speaker.

According to another aspect of the present invention, there is provided an apparatus for audio bass enhancement using stereo speakers, the apparatus including an input signal generator which generates an input signal by combining left and right signals; a low-pass filter which calculates a blocking frequency based on the distance between first and second speakers and filters a baseband signal of the combined signal whose frequency is lower than the blocking frequency; a delayer which delays the filtered baseband signal for a predetermined time period; a third signal combiner which combines the input signal and the left signal and makes the combined signal correspond to the first speaker; and a fourth signal combiner which combines the delayed signal and the right signal and makes the combined signal correspond to the second speaker.

According to another aspect of the present invention, there is provided a method of enhancing audio bass using stereo speakers, the method including filtering a baseband signal of an input signal whose frequency is lower than a blocking frequency calculated based on the distance between first and second speakers; delaying the filtered baseband signal for a predetermined time period; combining a signal component of the input signal output from the first speaker and a signal component of the delayed signal output from the first speaker, and making the combined signal component correspond to the first speaker; and combining a signal component of the input signal output from the second speaker and a signal component of the delayed signal output from the second speaker, and making the combined signal component correspond to the second speaker.

According to another aspect of the present invention, there is provided a method of enhancing audio bass using stereo speakers, the method including generating an input signal by combining left and right signals; filtering a baseband signal of an input signal whose frequency is lower than a blocking frequency calculated based on the distance between first and second speakers; delaying the filtered baseband signal for a predetermined time period; combining the input signal and the left signal and making the combined signal correspond to the first speaker; and combining the delayed signal and the right signal and making the combined signal correspond to the second speaker.

According to another aspect of the present invention, there is provided a computer-readable recording medium storing a computer program for executing the method of enhancing audio bass using stereo speakers.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining embodiments of the invention with reference to the attached drawings.

Figure 1A:
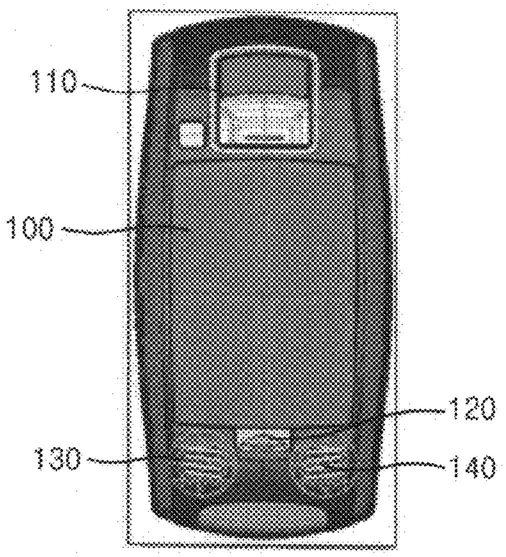
FIG. 1A is a view of the shape of a mobile phone used in an embodiment of the present invention.
Figure 1B:
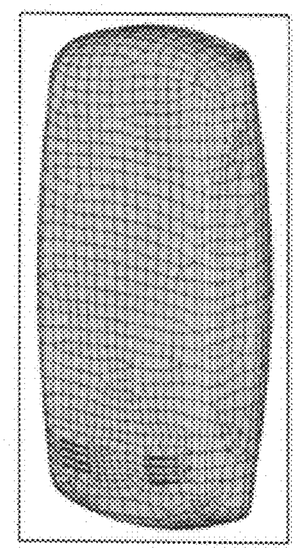
FIG. 1B is a view of a numerical analysis model for numerically analyzing the mobile phone illustrated in FIG. 1A.
Figure 1C:
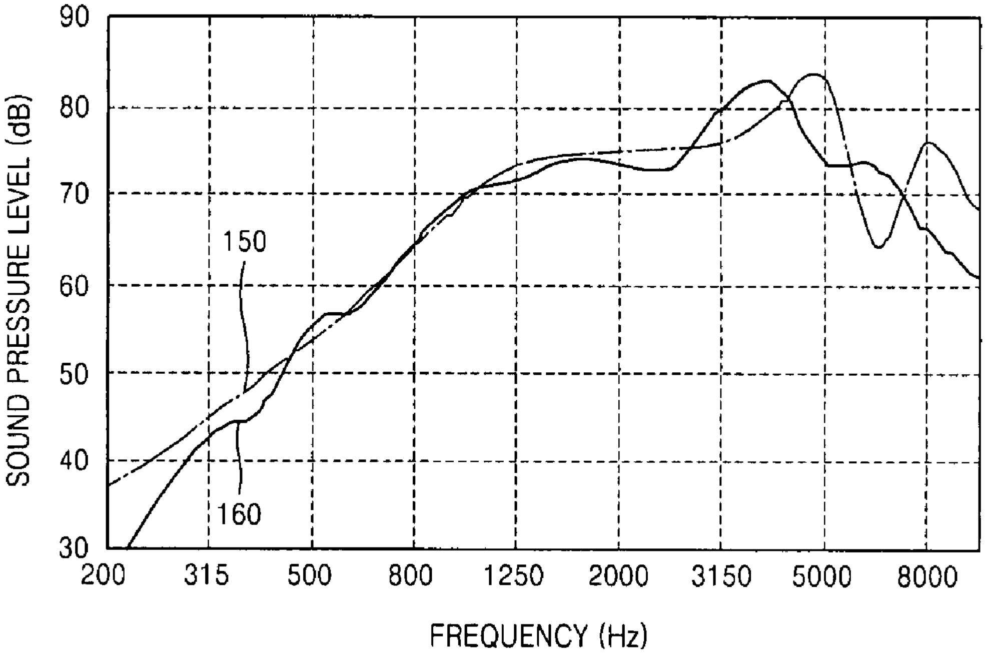
FIG. 1C is a graph of a curve of acoustic characteristics measured at a predetermined reference position in an acoustically dead room and a curve of acoustic characteristics measured by using numerical analysis.

FIGS. 1A through 1C are views of the shape of a mobile phone used in an embodiment of the present invention, a numerical analysis model, and an analysis result of acoustic radiation, respectively.

The present invention can be realized in small-sized portable terminals such as mobile phones. The mobile phones used in embodiments of the present invention include two speakers.

In general, two methods are used for analyzing acoustic radiation from a sound source. The first method is measuring acoustic radiation by experimentation using a microphone in an acoustically dead room where the effect of surrounding sound sources is minimized. The second method is measuring acoustic radiation using numerical analysis by modeling a sound source by analysis and providing a predetermined condition to the surroundings of the remodeled sound source. A method of analyzing acoustic radiation by actual experimentation as in the first method is more accurate. However, it is difficult to measure acoustic radiation from a sound source at all positions around the sound source. Therefore, the second method is more appropriate for analyzing acoustic radiation. In the second method, the analysis result may not be as reliable as the first method.

However, numerical analysis methods have made rapid progress according to the development of computer analysis capabilities, and thus the second method, that is, numerically analyzing acoustic radiation, may obtain a result as accurate as the result of the first method, that is, analyzing acoustic radiation by experimentation. The fact that numerical analysis is as accurate as actual experimentation is shown in FIGS. 1A through 1C.

FIG. 1A is a view of the shape of a mobile phone used in an embodiment of the present invention. Referring to FIG. 1, the mobile phone includes a rectangular display window 100 disposed at the center of the mobile phone, a receiver 110 disposed at the top center of the mobile phone for receiving phone-calls, a microphone 120 disposed at the bottom center of the mobile phone, and speakers 130 and 140 respectively disposed at the left and right of the microphone 120.

FIG. 1B is a view of a numerical analysis model for numerically analyzing the mobile phone illustrated in FIG. 1A. Referring to FIG. 1B, the model is illustrated by using lattices to analyze the shape of the mobile phone illustrated in FIG. 1

FIG. 1C is a graph of a curve 150 of acoustic characteristics measured at a predetermined reference position in an acoustically dead room and a curve 160 of acoustic characteristics measured by using numerical analysis. Referring to FIG. 1C, when the two curves 150 and 160 are compared with each other, it can be seen that the curves 150 and 160 are very close in a range of low frequencies. As a result, it is clear that general acoustic characteristics can be measured accurately by using numerical analysis. Specifically, although the curve 150 illustrates acoustic characteristics measured at a predetermined reference position in an acoustically dead room, when the application illustrated in FIG. 1C is expanded, the curve 150 can also be applied to all positions of the acoustically dead room. Since the curve of acoustic characteristics measured in the acoustically dead room and the curve of acoustic characteristics measured by using numerical analysis are almost identical, a result of acoustic radiation from a sound source can be obtained by using numerical analysis, which is the same as the result measured in the acoustically dead room.

FIGS. 2A through 2D are views illustrating radiation characteristics of a sound source in accordance with frequency variations of a signal output from the sound source using a numerical analysis model, assuming that the sound source exists in speakers of a mobile phone, according to an embodiment of the present invention. Since the mobile phone used in an embodiment of the present invention includes two speakers, FIGS. 2A through 2D illustrate radiation characteristics of the sound sources in accordance with frequency variations assuming that the sound sources exist in each of the speakers included in the mobile phone.

Figure 2A:
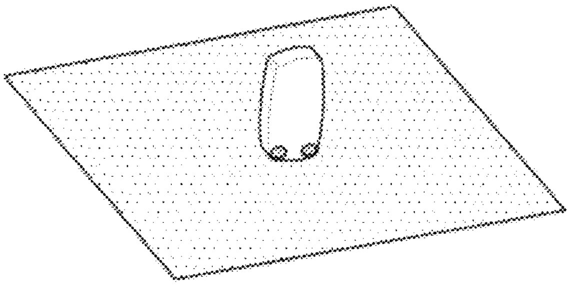
FIGS. 2A through 2D are views illustrating radiation characteristics of sound sources in accordance with frequency variations of a signal output from the sound sources using a numerical analysis model, assuming that the sound sources exist in speakers of a mobile phone, according to an embodiment of the present invention.

FIG. 2A is a view of a numeral analysis model according to an embodiment of the present invention. Here, a dotted plate under the numeral analysis model is used for providing spatial references in order to figure out radiation shapes.

Figure 2B:
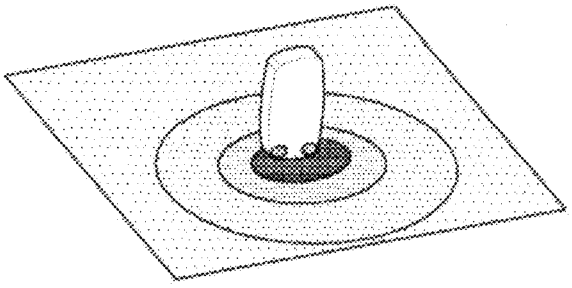

FIG. 2B is a view of radiation shapes radiating from sound sources when a 1 kilo hertz (KHz) signal is output from the sound sources. Referring to FIG. 2B, if the 1 KHz signal is output from the sound sources, the radiation shapes radiating from the sound sources are concentric circles.

Figure 2C:
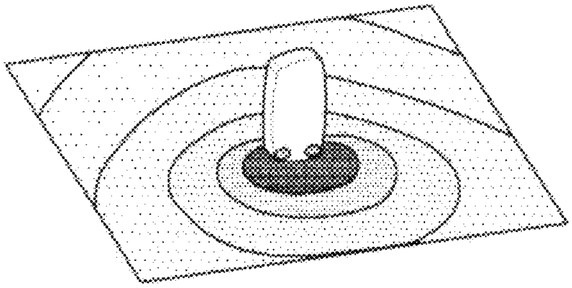

FIG. 2C is a view of radiation shapes radiating from sound sources when a 2 KHz signal is output from the sound sources. Referring to FIG. 2C, if the 2 KHz signal is output from the sound sources, the radiation shapes radiating from the sound sources toward the front of the sound sources are different from the shapes radiating from the sound sources toward the back of the sound sources.

Figure 2D:
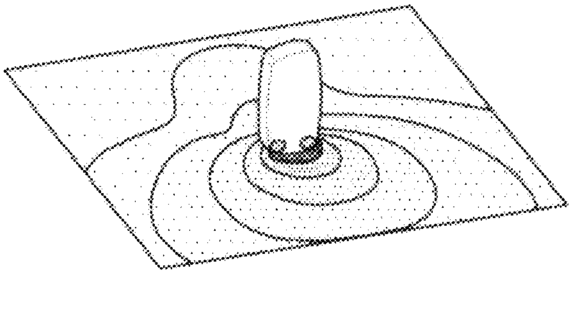

FIG. 2D is a view of radiation shapes radiating from sound sources when a 4 KHz signal is output from the sound sources. Referring to FIG. 2D, if the 4 KHz signal is output from the sound sources, the radiation shapes radiating from the sound sources toward the front of the sound sources are even more different from the shapes radiating from the sound sources toward the back of the sound sources.

As illustrated in FIGS. 2A through 2D, radiation shapes radiating from sound sources in accordance with frequency variations of a signal output from the sound sources are close to concentric circles as the frequency of the signal is low, whereas the shapes in front of the sound sources are different from the shapes in the back of the sound sources as the frequency of the signal is high.

The fact that the radiation shapes are concentric circles means that audio signals radiate as if the audio signals radiate from one sound source. That is, when different audio signals at a low frequency band are provided to left and right speakers, an audience actually regards the audio signals as if they are one signal, not different stereo signals from the left and right speakers.

An embodiment of present invention utilizes the fact that radiation shapes are concentric circles when sound sources have low frequencies. Specifically, when the distance between left and right speakers for reproducing audio signals is relatively short, the left and right speakers are regarded as one speaker if frequencies of the audio signals are low.

Figure 3:
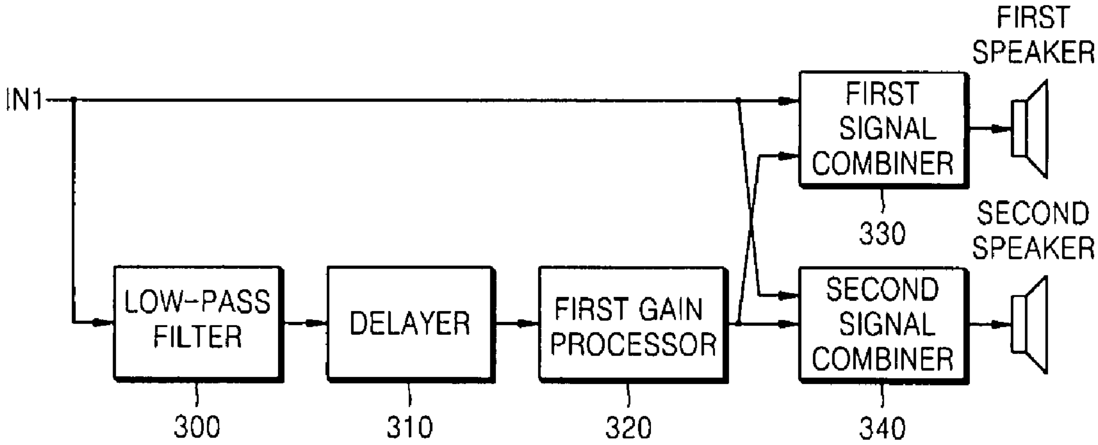
FIG. 3 is a view of an apparatus for audio bass enhancement using stereo speakers according to a first embodiment of the present invention.

FIG. 3 is a view of an apparatus for audio bass enhancement using stereo speakers according to a first embodiment of the present invention.

Referring to FIG. 3, the apparatus for audio bass enhancement using stereo speakers includes a low-pass filter 300, a delayer 310, a first gain processor 320, a first signal combiner 330, and a second signal combiner 340.

The low-pass filter 300 filters a baseband signal from a signal input through an input terminal IN1. Here, a blocking frequency, that is, a reference frequency for filtering the baseband signal, can be calculated based on the distance between speakers. The present embodiment utilizes the fact that, as illustrated in FIG. 2B, when the distance between two speakers is short, an audio signal below a predetermined frequency output from the two speakers is regarded as if output from one speaker. Specifically, in a mobile phone in which the distance between the two speakers is fixed, the maximum frequency at which it can be regarded as if the audio signal is output from one speaker is calculated and the maximum frequency is set as the blocking frequency of the low-pass filter 300. Then, the baseband signal below the blocking frequency is filtered using the low-pass filter 300. An audience, however, regards the filtered signal that is output from the two speakers, as if it is output from one speaker.

Figure 4A:
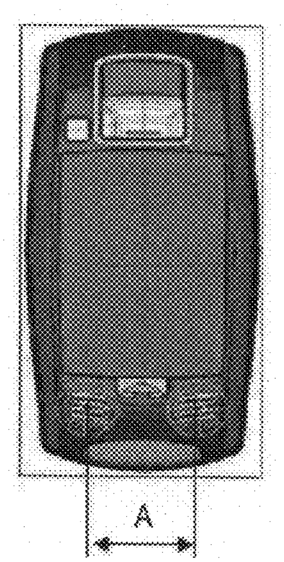
FIG. 4A is a view illustrating the distance between speakers when calculating frequencies in which sound sources output from left and right speakers of a slide mobile phone used in an embodiment of the present invention are recognized as one sound source.

FIG. 4A is a view illustrating the distance between speakers when calculating frequencies in which sound sources output from left and right speakers of a slide mobile phone used in an embodiment of the present invention are recognized as one sound source.

Referring to FIG. 4A, the distance between the speakers of the slide phone is denoted as A. Accordingly, with regard to a slide phone, a blocking frequency of a low-pass filter can be calculated by using the distance A.

Figure 4B:
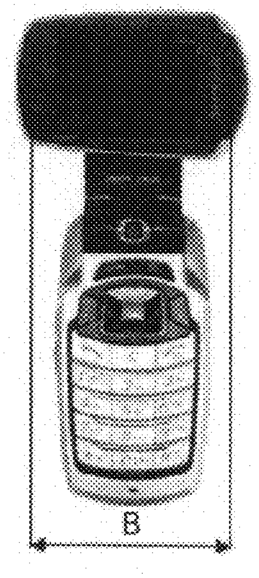
FIG. 4B is a view illustrating the distance between speakers when calculating frequencies in which sound sources output from left and right speakers of a swing mobile phone used in an embodiment of the present invention are recognized as one sound source.

FIG. 4B is a view illustrating the distance between speakers when calculating frequencies in which sound sources output from left and right speakers of a swing mobile phone used in an embodiment of the present invention are recognized as one sound source.

Here, the swing phone is a mobile phone whose screen part is rotatable. Speakers are disposed on the left and right of the screen part when rotated by 90°. Referring to FIG. 4B, the distance between the speakers of the swing phone is denoted as B. Accordingly, with regard to a swing phone, a blocking frequency of a low-pass filter can be calculated by using the distance B.

Referring back to FIG. 3, the blocking frequency of the low-pass filter 300 can be calculated by Equation 1 which represents correlations between a wavelength, the blocking frequency and the speed of sound in the air. Specifically, assuming that the distance A or the distance B is a half a wavelength (λ/2), the available blocking frequency at normal temperature (speed of sound c=340 m/s) can be calculated by using Equation 1. That is, the blocking frequency is the speed of sound divided by the wavelength. Here, since the sound speed is 340 m/s at normal temperature, the blocking frequency is calculated from the wavelength.

$$f=c/\lambda \tag{1}$$

where f is a blocking frequency, c is the speed of sound, and λ is a wavelength.

According to an embodiment of the present invention, it is assumed that the distance between the speakers is a half of the wavelength. That is, the distance A or B is a half of the wavelength λ, and thus the blocking frequency is calculated from the distance between the speakers. For example, when the distance A or B is 10 cm, the wavelength λ is 20 cm. Therefore, the blocking frequency is calculated to be 1.7 KHz by using Equation 1 (34,000/20=1,700).

Thus, with respect to a signal below approximately 1.7 KHz, it is difficult to determine the difference of sound sources from left and right speakers. As a result, if different left and right signals are output from speakers with respect to the signal that is below 1.7 KHz, audio bass enhancement is enabled. As described above, a frequency calculated using the distance of the speakers is set as the blocking frequency of the low-pass filter 300, and the low-pass filter 300 filters the baseband signal from an input signal below the blocking frequency and outputs the signal.

The delayer 310 receives the baseband signal filtered by the low-pass filter 300, delays the signal for a predetermined time period, and then outputs the signal. Here, the time period for delaying the signal is determined in accordance with the frequency of the signal that is to be enhanced. Assuming that the frequency is the reciprocal of time (f=1/t, where f is a frequency and t is time), since time is the reciprocal of the frequency (t=1/f), the delay time period is calculated from the frequency of the signal that is to be enhanced. For example, when a 500 hertz (Hz) signal is to be enhanced, the delay time period is calculated to 0.002 (s), that is, the reciprocal of 500 Hz. As described above, the delay time period of the delayer 310 is determined in accordance with the frequency of the signal to be enhanced. However, the range of the frequency is limited. Since the baseband signal filtered by the low-pass filter 300 is enhanced according to an embodiment of the present invention, the frequency of the signal that is to be enhanced is not greater than the blocking frequency of the low-pass filter 300. The delay time period of the delayer 310 is calculated with reference to frequencies below the blocking frequency of the low-pass filter 300.

The first gain processor 320 multiplies the signal delayed by the delayer 310 by a first gain. Here, the first gain is set so that sound unbalance between first and second speakers, which can be caused by a delay of the signal, is compensated for.

The first signal combiner 330 combines a signal component of the input signal output from the first speaker and a signal component of the delayed signal multiplied by the first gain and output from the first speaker, and makes the combined signal component correspond to the first speaker. Here, if the second speaker is the left speaker, a signal component output from the second speaker is a left signal component. If the second speaker is the right speaker, a signal component output from the second speaker is a right signal component.

The second signal combiner 340 combines a signal component of the input signal output from the second speaker and a signal component of the delayed signal multiplied by the first gain and output from the second speaker, and makes the combined signal component correspond to the second speaker. Here, if the first speaker is the left speaker, a signal component output from the first speaker is the left signal component. If the first speaker is the right speaker, a signal component output from the first speaker is the right signal component.

As described above, the baseband signal of the input signal is filtered by the first and second signal combiners 330 and 340, the filtered baseband signal is delayed, and then the left and right signal components correspond to the left and right speakers and are output respectively therefrom. Accordingly, a signal in which audio bass is enhanced may be provided to the audience.

Figure 5:
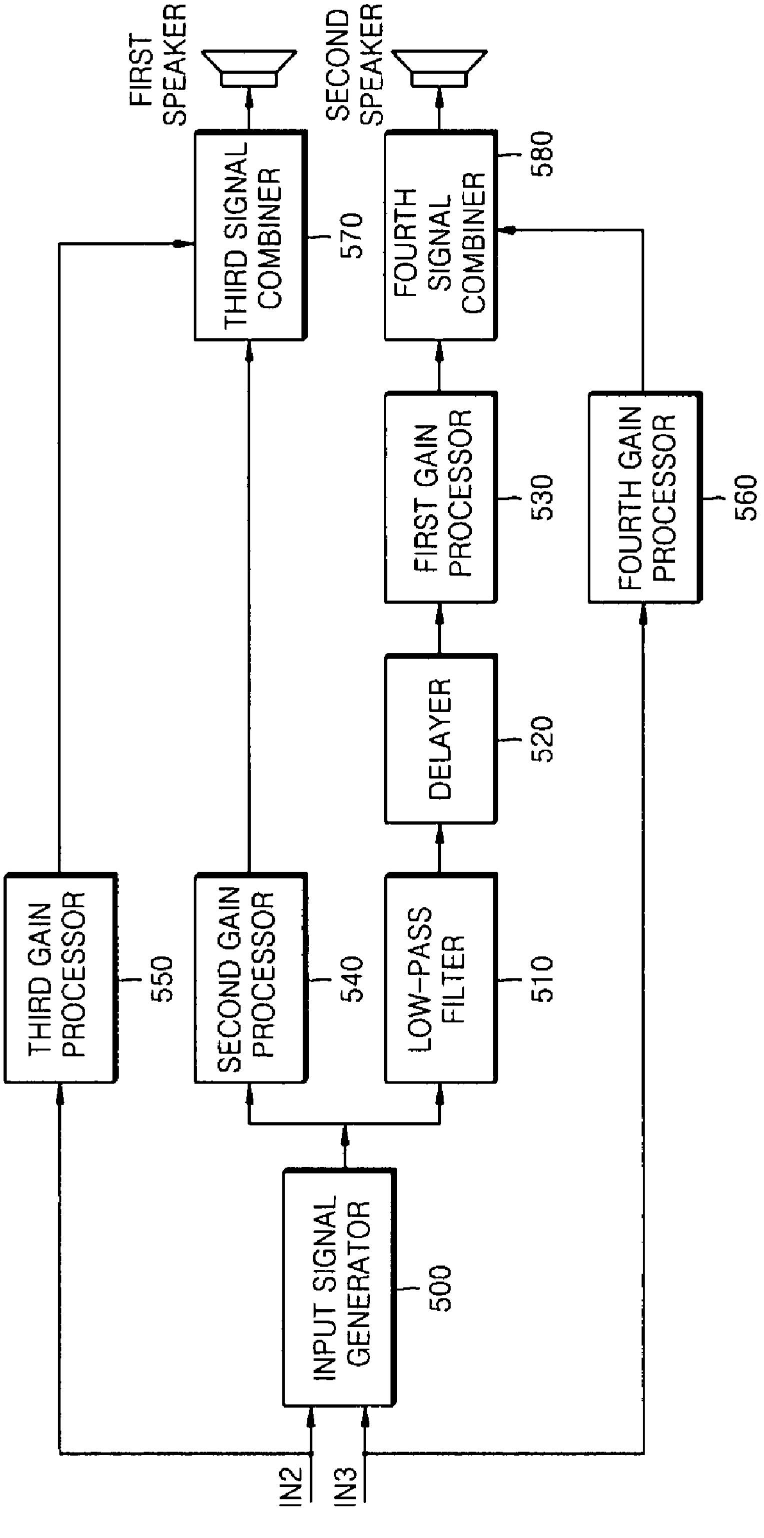
FIG. 5 is a view of an apparatus for audio bass enhancement using stereo speakers according to a second embodiment of the present invention.

FIG. 5 is a view of an apparatus for audio bass enhancement using stereo speakers according to a second embodiment of the present invention.

Referring to FIG. 5, the apparatus for audio bass enhancement using stereo speakers includes an input signal generator 500, a low-pass filter 510, a delayer 520, first through fourth gain processors 530, 540, 550 and 560, a third signal combiner 570 and a fourth signal combiner 580. The apparatus for audio bass enhancement using stereo speakers according to the current embodiment is used when left and right signals are input.

The input signal generator 500 receives the left signal through input terminal IN2 and receives the right signal through input terminal IN3. The input signal generator 500 generates one input signal by combining the left and right signals. The left signal is a signal component output from a left speaker, and the right signal is a signal component output from a right speaker.

The low-pass filter 510 filters a baseband signal of the input signal. Here, a blocking frequency, that is, a reference frequency for filtering a baseband signal, can be calculated by applying the distance between speakers to Equation 1. Calculation of the blocking frequency is the same as the calculation of a blocking frequency described in relation to FIG. 3. The calculated blocking frequency is set in the low-pass filter 510.

The delayer 520 receives the baseband signal filtered by the low-pass filter 510, delays the signal for a predetermined time period, and then outputs the signal. Here, the delay time period is determined in accordance with a frequency of the signal that is to be enhanced. Calculation of the delay time period is the same as the calculation of a delay time period described in relation to FIG. 3.

The first gain processor 530 multiplies the signal delayed by the delayer 520 by a first gain.

The second gain processor 540 multiplies the input signal generated by the input signal generator 500 by a second gain.

The third gain processor 550 multiplies the left signal by a third gain.

The fourth gain processor 560 multiplies the right signal by a fourth gain.

As described above, the apparatus for audio bass enhancement using stereo speakers according to the current embodiment includes the third gain processor 550 which multiplies the left signal by the third gain, the fourth gain processor 560 which multiplies the right signal by the fourth gain, the second gain processor 540 which multiplies the input signal by the second gain, and the first gain processor 530 which multiplies the delayed signal by the first gain. Here, the first through fourth gains are set so that sound unbalance between the first and second speakers, which can be caused by a delay of the signal, is compensated for.

The third signal combiner 570 combines the input signal multiplied by the second gain and the left signal multiplied by the third gain, and makes the combined signal correspond to a first speaker. The first speaker outputs a left signal component.

The fourth signal combiner 580 combines the delayed signal multiplied by the first gain and the right signal multiplied by the fourth gain, and makes the combined signal correspond to a second speaker. The second speaker outputs a right signal component.

As described above, the baseband signal of the input signal is filtered by the third and fourth signal combiners 570 and 580, the filtered baseband signal is delayed, and then the left and right signal components correspond to the left and right speakers and are respectively output therefrom. If the distance between the speakers is short as in the current embodiment, left and right sound sources in which audio bass is enhanced are obtained by outputting the signal components from the two speakers with a temporal gap. According to the current embodiment, the third signal combiner 570 combines signal components into the left signal component and the fourth signal combiner 580 combines signal components into the right signal component, but the present invention is not limited thereto. The third signal combiner 570 may combine signal components into the left signal component and the fourth signal combiner 580 may combine signal components into the right signal component.

Figure 6:
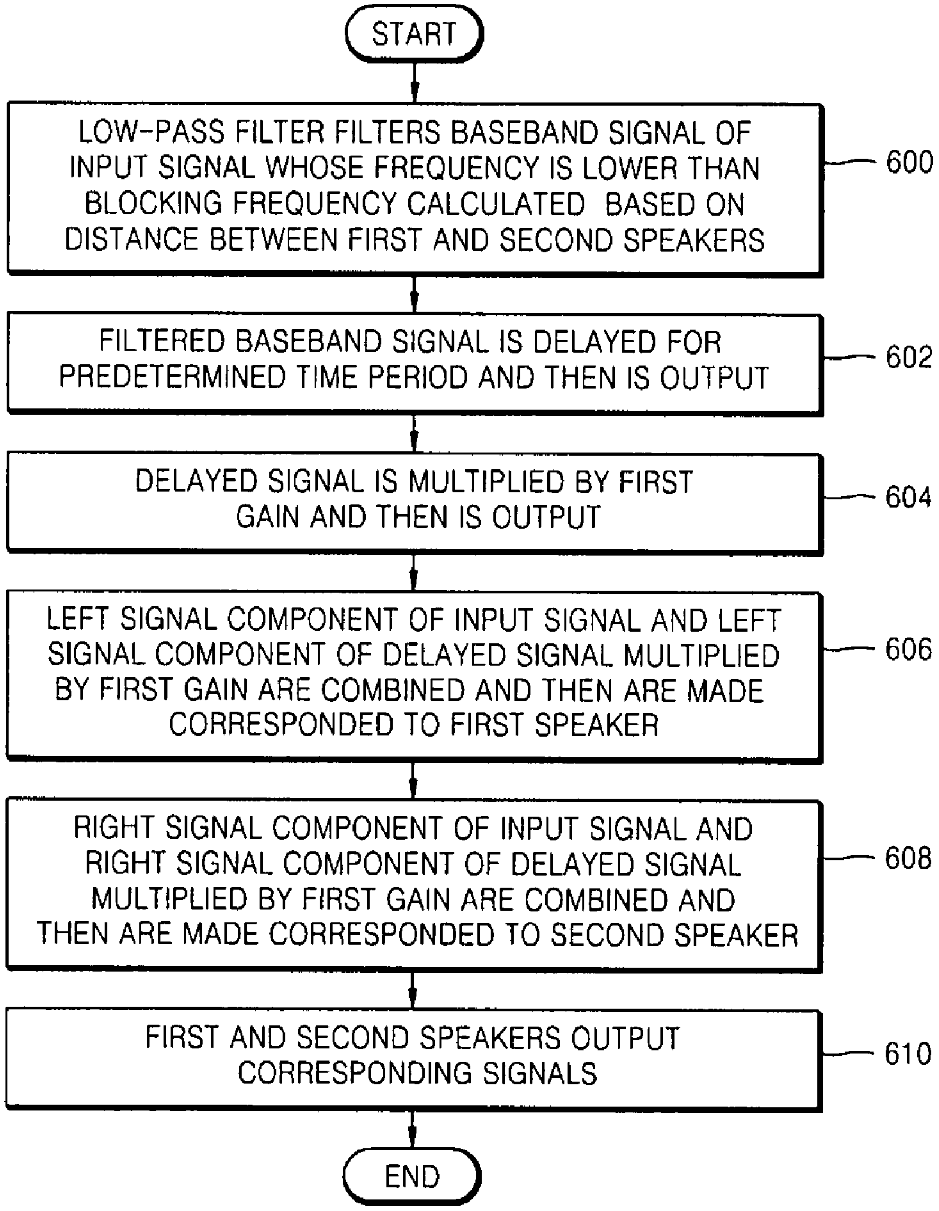
FIG. 6 is a flowchart of a method of enhancing audio bass using stereo speakers according to the first embodiment of the present invention.

FIG. 6 is a flowchart of a method of enhancing audio bass using stereo speakers according to the first embodiment of the present invention.

In operation 600, a low-pass filter filters a baseband signal of an input signal whose frequency is lower than a blocking frequency calculated based on the distance between first and second speakers. The blocking frequency of the low-pass filter is calculated by using Equation 1. A wavelength is obtained using the fact that the distance between the first and second speakers is half the wavelength. The blocking frequency is calculated by substituting the wavelength obtained based on the distance of the first and second speakers and the speed of sound for Equation 1. The calculated blocking frequency is set in the low-pass filter.

In operation 602, the filtered baseband signal is delayed for a predetermined time period and is then output. Here, the delay time period is determined in accordance with a frequency of the signal that is to be enhanced. Assuming that a frequency is the reciprocal of time (f=1/t, where f is a frequency and t is time), since time is the reciprocal of a frequency (t=1/f), the delay time period is calculated from the frequency of the signal to be enhanced. For example, when a 500 hertz (Hz) signal is to be enhanced, the delay time period is set to 0.002 (s), the reciprocal of 500 Hz. Since the baseband signal filtered by the low-pass filter is enhanced according to an embodiment of the present invention, the frequency of the signal that is to be enhanced is not greater than the blocking frequency of the low-pass filter.

In operation 604, the delayed signal is multiplied by a first gain and is then output. Here, the first gain is set so that sound unbalance between first and second speakers, which can be caused by a delay of the signal, is compensated for.

In operation 606, a signal component of the input signal output from the first speaker and a signal component of the delayed signal multiplied by the first gain and output from the first speaker are combined and then are made to correspond to the first speaker. The signal components of the input signal and the delayed signal which are output from the first speaker are combined, and are made to correspond to the first speaker and are output therefrom.

In operation 608, a signal component of the input signal output from the second speaker and a signal component of the delayed signal multiplied by the first gain and output from the second speaker are combined and then correspond to the second speaker. The signal components of the input signal and the delayed signal which are output from the second speaker are combined, and then correspond to the second speaker and are output therefrom.

In operation 610, the first and second speakers output the corresponding signal components. If the first speaker is a left speaker and the second speaker is a right speaker, the first speaker outputs a left signal and the second speaker outputs a right signal. On the other hand, if the first speaker is the right speaker and the second speaker is the left speaker, the first speaker outputs the right signal and the second speaker outputs the left signal.

Figure 7:
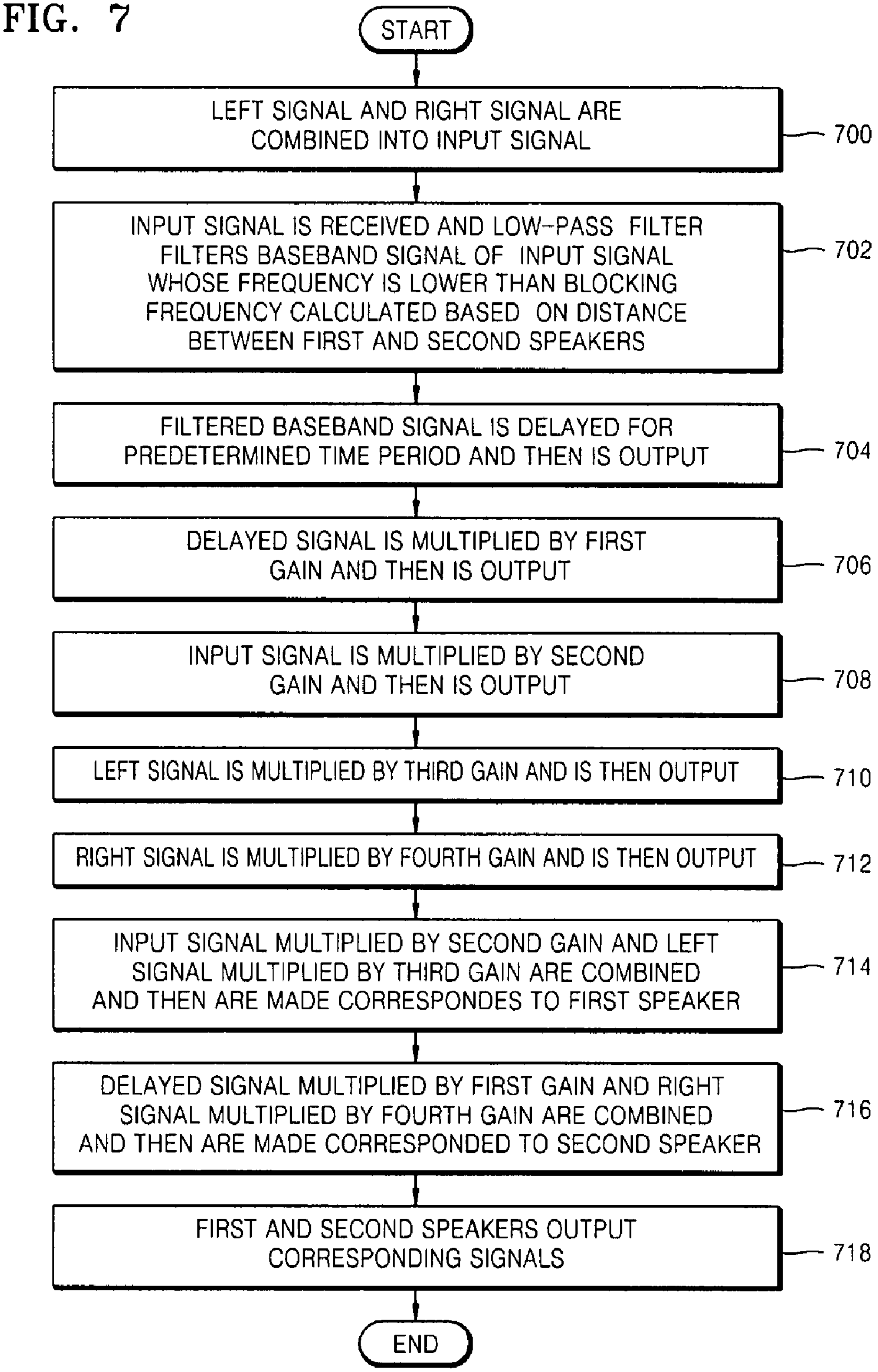
FIG. 7 is a flowchart of a method of enhancing audio bass using stereo speakers according to the second embodiment of the present invention.

FIG. 7 is a flowchart of a method of enhancing audio bass using stereo speakers according to the second embodiment of the present invention. The apparatus for audio bass enhancement using stereo speakers according to the current embodiment is used when left and right signals are input.

In operation 700, a left signal and a right signal are combined into one input signal. Here, the left signal is a signal component output from a left speaker, and the right signal is a signal component output from a right speaker.

In operation 702, the input signal is received and a low-pass filter filters a baseband signal of the input signal whose frequency is lower than a blocking frequency calculated based on the distance between first and second speakers. The blocking frequency of the low-pass filter is calculated by using Equation 1. A wavelength is obtained using the fact that the distance between the first and second speakers is half the wavelength. The blocking frequency is calculated by substituting the wavelength obtained based on the distance of the first and second speakers and the speed of sound for Equation 1. The calculated blocking frequency is set in the low-pass filter.

In operation 704, the filtered baseband signal is delayed for a predetermined time period and is then output. Here, the delay time period is determined in accordance with a frequency of the signal that is to be enhanced. Assuming that a frequency is the reciprocal of time (f=1/t, where f is a frequency and t is time), since time is the reciprocal of a frequency (t=1/f), the delay time period is calculated from the frequency of the signal to be enhanced. For example, when a 500 hertz (Hz) signal is to be enhanced, the delay time period is set to 0.002 (s), the reciprocal of 500 Hz. Since the baseband signal filtered by the low-pass filter is enhanced according to an embodiment of the present invention, the frequency of the signal that is to be enhanced is not greater than the blocking frequency of the low-pass filter.

In operation 706, the delayed signal is multiplied by a first gain and is then output.

In operation 708, the input signal is multiplied by a second gain and is then output.

In operation 710, the left signal is multiplied by a third gain and is then output.

In operation 712, the right signal is multiplied by a fourth gain and is then output.

Here, the first through fourth gains are set so that sound unbalance between the first and second speakers, which can be caused by a delay of the signal, is compensated for.

In operation 714, the input signal multiplied by the second gain and the left signal multiplied by the third gain are combined and then are made to correspond to the first speaker.

In operation 716, the delayed signal multiplied by the first gain and the right signal multiplied by the fourth gain are combined and then are made to correspond to the second speaker.

In operation 718, the first and second speakers respectively output the corresponding signals. The first speaker outputs the left signal and the second speaker outputs the right signal.

The embodiments of the present invention can be written as computer programs and can be implemented in general-use digital computers that execute the programs using a computer readable recording medium.

The data structure used in the embodiments of the present invention can be stored on the computer readable recording medium by a plurality of methods.

Examples of the computer readable recording medium include magnetic storage media (e.g., ROM, floppy disks, hard disks, etc.), optical recording media (e.g., CD-ROMs, or DVDs), and storage media such as carrier waves (e.g., transmission through the Internet).

As described above, according to the present invention, by filtering a baseband signal of an input signal whose frequency is lower than a blocking frequency calculated based on the distance between first and second speakers, delaying the filtered signal for a predetermined time period, combining a signal component of the input signal output from the first speaker and a signal component of the delayed signal output from the first speaker and making the combined signal component correspond to the first speaker, and combining a signal component of the input signal output from the second speaker and a signal component of the delayed signal output from the second speaker and making the combined signal component correspond to the second speaker, deep and rich audio bass can be provided by performing a simple operation without structural modification of speakers with respect to micro speakers in which audio bass reproduction is not performed efficiently. Also, the present invention can be realized in a mobile phone having an economical digital signal processor (DSP) due to the simple operation.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. An apparatus for audio bass enhancement using stereo speakers, the apparatus comprising:

a low-pass filter which calculates a blocking frequency based on the speed of sound and the distance between first and second speakers and filters a baseband signal of an input signal whose frequency is lower than the blocking frequency;

a delayer which delays the filtered baseband signal for a predetermined time period;

a first signal combiner which combines a signal component of the input signal output from the first speaker and a signal component of the delayed signal output from the first speaker, and makes the combined signal component correspond to the first speaker; and a second signal combiner which combines a signal component of the input signal output from the second speaker and a signal component of the delayed signal output from the second speaker, and makes the combined signal component correspond to the second speaker.

2. The apparatus for audio bass enhancement using stereo speakers of claim 1, the apparatus further comprising a first gain processor which multiplies the delayed signal by a first gain, wherein the first signal combiner combines a signal component of the input signal output from the first speaker and a signal component of the delayed signal multiplied by the first gain and output from the first speaker, and makes the combined signal component correspond to the first speaker; and the second signal combiner combines a signal component of the input signal output from the second speaker and a signal component of the delayed signal multiplied by the first gain and output from the second speaker, and makes the combined signal component correspond to the second speaker.

3. The apparatus for audio bass enhancement using stereo speakers of claim 2, wherein the blocking frequency of the low-pass filter is calculated by dividing the speed of sound by a wavelength which corresponds to twice the distance between the first and second speakers.

4. The apparatus for audio bass enhancement using stereo speakers of claim 3, wherein the predetermined time corresponds to the reciprocal of a frequency that is less than the blocking frequency.

5. The apparatus for audio bass enhancement using stereo speakers of claim 2, wherein the first gain is set so that sound unbalance between signals output from the first and second speakers is compensated for.

6. An apparatus for audio bass enhancement using stereo speakers, the apparatus comprising:

an input signal generator which generates an input signal by combining left and right signals;

a low-pass filter which calculates a blocking frequency based on the speed of sound and the distance between first and second speakers and filters a baseband signal of the combined signal whose frequency is lower than the blocking frequency;

a delayer which delays the filtered baseband signal for a predetermined time period;

a third signal combiner which combines the input signal and the left signal and makes the combined signal correspond to the first speaker; and a fourth signal combiner which combines the delayed signal and the right signal and makes the combined signal correspond to the second speaker.

7. The apparatus for audio bass enhancement using stereo speakers of claim 6, the apparatus further comprising:

a first gain processor which multiplies the delayed signal by a first gain;

a second gain processor which multiplies the input signal by a second gain;

a third gain processor which multiplies the left signal by a third gain; and a fourth gain processor which multiplies the right signal by a fourth gain, wherein the third signal combiner combines the input signal multiplied by the second gain and the left signal multiplied by the third gain, and makes the combined signal correspond to the first speaker; and the fourth signal combiner combines the delayed signal multiplied by the first gain and the right signal multiplied by the fourth gain, and makes the combined signal correspond to the second speaker.

8. The apparatus for audio bass enhancement using stereo speakers of claim 7, wherein the blocking frequency of the low-pass filter is calculated by dividing the speed of sound by a wavelength which corresponds to twice the distance between the first and second speakers.

9. The apparatus for audio bass enhancement using stereo speakers of claim 8, wherein the predetermined time corresponds to the reciprocal of a frequency that is less than the blocking frequency.

10. The apparatus for audio bass enhancement using stereo speakers of claim 7, wherein the first gain is set so that sound unbalance between signals output from the first and second speakers is compensated for.

11. A method of enhancing audio bass using stereo speakers, the method comprising:

(a) filtering a baseband signal of an input signal whose frequency is lower than a blocking frequency calculated based on the speed of sound and the distance between first and second speakers;

(b) delaying the filtered baseband signal for a predetermined time period;

(c) combining a signal component of the input signal output from the first speaker and a signal component of the delayed signal output from the first speaker, and making the combined signal component correspond to the first speaker; and (d) combining a signal component of the input signal output from the second speaker and a signal component of the delayed signal output from the second speaker, and making the combined signal component correspond to the second speaker.

12. The method of enhancing audio bass using stereo speakers of claim 11, the method further comprising multiplying the delayed signal by a first gain, wherein operation (c) is performed by combining a signal component of the input signal output from the first speaker and a signal component of the delayed signal multiplied by the first gain and output from the first speaker, and making the combined signal component correspond to the first speaker; and operation (d) is performed by combining a signal component of the input signal output from the second speaker and a signal component of the delayed signal multiplied by the first gain and output from the second speaker, and making the combined signal component correspond to the second speaker.

13. The method of enhancing audio bass using stereo speakers of claim 12, wherein the blocking frequency of the low-pass filter is calculated by dividing the speed of sound by a wavelength which corresponds to twice the distance between the first and second speakers.

14. The method of enhancing audio bass using stereo speakers of claim 13, wherein the predetermined time corresponds to the reciprocal of a frequency that is less than the blocking frequency.

15. The method of enhancing audio bass using stereo speakers of claim 12, wherein the first gain is set so that sound unbalance between signals output from the first and second speakers is compensated for.

16. A method of enhancing audio bass using stereo speakers, the method comprising:

(a) generating an input signal by combining left and right signals;

(b) filtering a baseband signal of an input signal whose frequency is lower than a blocking frequency calculated based on the speed of sound and the distance between first and second speakers;

(c) delaying the filtered baseband signal for a predetermined time period;

(d) combining the input signal and the left signal and making the combined signal correspond to the first speaker; and (e) combining the delayed signal and the right signal and making the combined signal correspond to the second speaker.

17. The method of enhancing audio bass using stereo speakers of claim 16, the method further comprising:

multiplying the delayed signal by a first gain;

multiplying the input signal by a second gain;

multiplying the left signal by a third gain; and multiplying the right signal by a fourth gain, wherein operation (d) is performed by combining the input signal multiplied by the second gain and the left signal multiplied by the third gain, and making the combined signal correspond to the first speaker; and operation (e) is performed by combining the delayed signal multiplied by the first gain and the right signal multiplied by the fourth gain, and making the combined signal correspond to the second speaker.

18. The method of enhancing audio bass using stereo speakers of claim 17, wherein the blocking frequency of the low-pass filter is calculated by dividing the speed of sound by a wavelength which corresponds to twice the distance between the first and second speakers.

19. The method of enhancing audio bass using stereo speakers of claim 18, wherein the predetermined time corresponds to the reciprocal of a frequency that is less than the blocking frequency.

20. The method of enhancing audio bass using stereo speakers of claim 17, wherein the first gain is set so that sound unbalance between signals output from the first and second speakers is compensated for.

21. A non-transitory computer-readable recording medium storing a computer program for executing a method of enhancing audio bass using stereo speakers, the method comprising:

(a) filtering a baseband signal of an input signal whose frequency is lower than a blocking frequency calculated based on the speed of sound and the distance between first and second speakers;

(b) delaying the filtered baseband signal for a predetermined time period;

(c) combining a signal component of the input signal output from the first speaker and a signal component of the delayed signal output from the first speaker, and making the combined signal component correspond to the first speaker; and (d) combining a signal component of the input signal output from the second speaker and a signal component of the delayed signal output from second speaker, making the combined signal component correspond to the second speaker.

* * * * *

UNITED STATES PATENT AND TRADEMARK OFFICE

CERTIFICATE OF CORRECTION

PATENT NO. : 8,311,239 B2
APPLICATION NO. : 11/896109
DATED : November 13, 2012
INVENTOR(S) : Jung-ho Kim et al.

It is certified that error appears in the above-identified patent and that said Letters Patent is hereby corrected as shown below:

In the Claims:

Column 14, Line 39, In Claim 21, after “from” insert -- the --.
Column 14, Line 39, In Claim 21, after “speaker,” insert -- and --.

Signed and Sealed this
Seventh Day of May, 2013

Teresa Stanek Rea
*Acting Director of the United States Patent and Trademark Office*